United States Patent
Zhu et al.

(10) Patent No.: US 7,724,003 B1
(45) Date of Patent: May 25, 2010

(54) SUBSTRATE CONDITIONING FOR CORONA CHARGE CONTROL

(75) Inventors: NanChang Zhu, Shanghai (CN); Jainou Shi, Milpitas, CA (US); Min Xiang, Shanghai (CN); ZiangHua Liu, Shanghai (CN); Goujun Zhang, Shanghai (CN); Xiafang Zhang, San Jose, CA (US); Shiyou Pei, Saratoga, CA (US); Liang-Guo Wang, San Jose, CA (US); Joseph R. Laia, Jr., Morgan Hill, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 310 days.

(21) Appl. No.: 11/938,355

(22) Filed: Nov. 12, 2007

Related U.S. Application Data

(60) Provisional application No. 60/970,575, filed on Sep. 7, 2007.

(51) Int. Cl.
*G01R 31/26* (2006.01)
(52) U.S. Cl. .................. 324/719; 324/765
(58) Field of Classification Search .......... 324/719, 324/765, 751–753; 438/14
See application file for complete search history.

(56) References Cited

U.S. PATENT DOCUMENTS

| | | | |
|---|---|---|---|
| 2005/0074909 A1* | 4/2005 | Steeples | 438/17 |
| 2005/0186690 A1* | 8/2005 | Chen et al. | 438/14 |

* cited by examiner

*Primary Examiner*—Vincent Q Nguyen
(74) *Attorney, Agent, or Firm*—Luedeka, Neely & Graham, P.C.

(57) ABSTRACT

A measurement system for taking a reading in a test zone on a surface of a substrate. A chamber forms an environment, a surface treatment station dispenses a stabilizing chemical in the test zone, a charge deposition station deposits a charge in the test zone, and a QV measurement station takes a QV based measurement in the test zone. Where the surface treatment station, the charge deposition station, and the QV measurement station all interact with the substrate within the chamber. In this manner, reliable QV measurements are taken on the substrate by controlling charge spreading with the stabilizing chemical. QV measurement stability is also improved by reducing the influence of the time trending on substrates with reactive dielectrics, such as on silicon oxynitride and high-k surfaces.

20 Claims, 1 Drawing Sheet

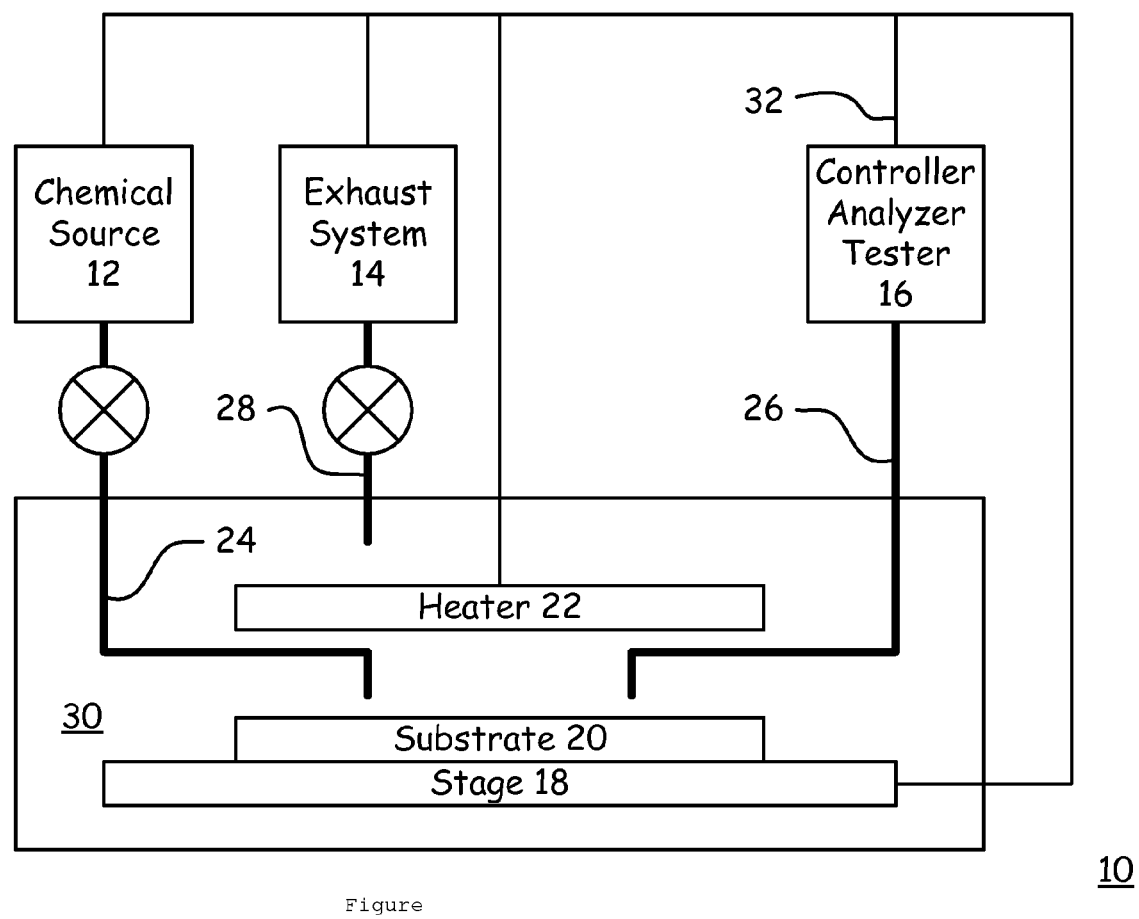
Figure

SUBSTRATE CONDITIONING FOR CORONA CHARGE CONTROL

This application claims all priorities and other benefits of prior U.S. provisional application 60/970,575, filed Sep. 7, 2007.

FIELD

This invention relates to the field of integrated circuit fabrication. More particularly, this invention relates to charge-voltage measurements on integrated circuit substrates.

BACKGROUND

Integrated circuits are often formed on substrates, such as substrates of semiconducting material. Such substrates can hold as few as one or many as thousands of the integrated circuits. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

Integrated circuits are subjected to many different tests and analyses during the fabrication cycle, to determine whether the materials and structures of the integrated circuits are formed correctly. Such tests typically include charge-voltage (QV) tests of the substrates on which the integrated circuits are formed.

A typical QV test runs in the following sequence:
(1) Move position A of the substrate under a corona gun,
(2) Deposit a charge Q at position A,
(3) Move position A under a voltage probe,
(4) Measure at least one of the surface voltage (V) and the surface photo voltage (SPV) at position A, and
(5) Repeat the steps as desired at additional positions.

There are at least two problems with this method, which are generally referred to as lateral spreading and time trending. The first problem is lateral spreading of the deposited corona charge. The deposited charge in step (2) tends to spread out on the substrate surface before the surface voltage is measured in step (4). The degree of the spreading is especially severe when the surface electrical conductivity is appreciable and the deposited area is small (such as less than about one millimeter in diameter). Unfortunately, the degree of spreading is difficult to predict quantitatively, and generally depends upon several factors, such as:
(1) Type of dielectric. The degree of spreading is tends to be generally greater in high-k materials than it is in silicon oxides. In addition, silicon oxynitride materials can also exhibit significant spreading.
(2) Prior processing of the substrate. For example, a silicon oxynitride layer without a final anneal tends to exhibit a significant degree of charge spreading. In contrast, a final anneal on the same layer generally reduces the charge spreading significantly. In general, any process that alters the surface structure and chemistry of the substrate would also tend to affect the degree of the charge spreading. Such processes include any heating, light illumination, and plasma processes.
(3) Ambient environment. The degree of spreading also generally depends on the environment in which the substrate is disposed. For example, the humidity of the environment significantly affects the degree of charge spreading. When the relative humidity is greater than about sixty percent, charge spreading is so great that a reliable QV measurement is typically not possible. Airborne molecules in the environment other than water can also affect the degree of charge spreading.

The second problem is time trending. Here, the QV measurement trends with the queue time of the substrate, which is defined as the length of time between the formation of the dielectric and the QV measurement. Silicon oxide exhibits a relatively lesser degree of time trending, but silicon oxynitride and high-k materials tend to exhibit a relatively greater degree of time trending. Similar to the problem of charge spreading, time trending also degrades the repeatability of QV measurements.

What is needed, therefore, is a system that overcomes problems such as those described above, at least in part.

SUMMARY

The above and other needs are met by a measurement system for taking a reading in a test zone on a surface of a substrate. A chamber forms an environment, a surface treatment station dispenses a stabilizing chemical in the test zone, a charge deposition station deposits a charge in the test zone, and a QV measurement station takes a QV based measurement in the test zone. Where the surface treatment station, the charge deposition station, and the QV measurement station all interact with the substrate within the chamber.

In this manner, the embodiments of the present invention enable reliable QV measurements on the substrate by controlling charge spreading, such as on silicon oxynitride and high-k surfaces, using the stabilizing chemical. These embodiments also improve QV measurement stability by reducing the influence of the time trending on substrates with reactive dielectrics, again such as on silicon oxynitride and high-k surfaces.

In various embodiments, the charge deposition station includes at least one of a corona discharge unit, a plasma generator, and an electron beam generator. In some embodiments the environment is at least one of a reduced pressure environment, an atmospheric pressure environment, and an elevated pressure environment filled at least in part with an inert gas. In some embodiments the test zone is all of the surface of the substrate. Some embodiments include an exhaust system to exhaust contaminants and effluents of the stabilizing chemicals. Some embodiments include a positioning system for moving the substrate within the chamber. In some embodiments the surface is formed of at least one of silicon oxide, silicon nitride, silicon oxynitride, silicon carbide, metal oxide, carbon doped oxide, and porous ultra low k materials.

In some embodiments the stabilizing chemical is in the form of at least one of a liquid, a vapor of the stabilizing chemical, and a mixture of a vapor of the stabilizing chemical and a carrier gas that is substantially inert. In some embodiments the stabilizing chemical includes at least one of HMDS, DCDMS, materials with Si—CH3 functional groups, H2, O2, O3, NH3, HFx, and hydrophobic chemical agents.

In some embodiments the surface treatment station includes a dispenser for dispensing the stabilizing chemical, where the dispenser does not make physical contact with the substrate, the dispenser including at least one of a piezo-actuated liquid injector, a microdropper, a laser injector, a water injector, and a spray nozzle. In some embodiments the surface treatment station includes a dispenser for dispensing the stabilizing chemical, with an electrical heater attached to the dispenser.

Some embodiments include a heater for heating at least one of the substrate and the stabilizing chemical, the heater including at least one of an ion plasma generator, an inductance furnace, a resistance furnace, a heat lamp, a laser, a microwave annealer, and an electron bombarder.

According to another aspect of the invention there is described a method for taking a reading in a test zone on a surface of a substrate, by forming an environment around the substrate, dispensing a stabilizing chemical in the test zone, depositing a charge in the test zone, taking a QV based measurement in the test zone, and removing the substrate from the environment.

In various embodiments according to this aspect of the invention, there is added the step of heating the test area for at least one of before, during, and after depositing the stabilizing chemical. Some embodiments include the step of heating the stabilizing chemical before dispensing it in the test zone. Some embodiments include the step of exhausting from the environment any vapors arising from the stabilizing chemical. Some embodiments include the step of removing any substantial residual of the stabilizing chemical from the substrate prior to removing the substrate from the environment.

BRIEF DESCRIPTION OF THE DRAWINGS

Further advantages of the invention are apparent by reference to the detailed description when considered in conjunction with the FIGURE, which is not to scale so as to more clearly show the details, wherein like reference numbers indicate like elements, and which depicts a functional block diagram of a system according to an embodiment of the present invention.

DETAILED DESCRIPTION

Various embodiments of the present invention propose a system that integrates a substrate conditioning unit (to stabilize the surface of the dielectric) and a test unit (to perform the QV based measurement). One embodiment of the method has the following sequential steps:

(1) Heat the substrate test area, (2) Dispense a heated stabilizing chemical on the substrate test area, (3) Continue to heat the substrate test area during dispensing, (4) Exhaust any vapors during dispensing and testing, (5) Conduct QV tests on the substrate test area, and (6) Remove the stabilizing chemical from the substrate test area.

The stabilizing chemicals include organics such as hexamethyl disilazane (HMDS) and dichlorodimethyl silane (DCDMS), materials with Si—$CH_3$ functional groups, inorganics such as $H_2$, $O_2$, $O_3$, $NH_3$, $HF_x$, and other chemical agents to repel water. In one embodiment, the stabilizing chemicals are sprayed onto an area that is no smaller than the intended corona deposited area, and the sprayed spot center is substantially aligned to the center of the intended corona deposited area.

The heating and chemical removal steps can be accomplished with methods such as ion plasma, inductance or resistance furnaces, light illumination with lamp or laser, microwave anneals, and electron bombardment. In one embodiment, a micro drop liquid dispenser unit is integrated into Quantox-1000 monitoring instrument, manufactured by KLA-Tencor Technologies Corporation of Milpitas California. The dispenser injects a drop of HMDS liquid of about fifty microns in diameter onto the test area of the substrate before a QV measurement is performed.

With reference now to the FIGURE, there is depicted a system 10 according to an embodiment of the present invention. The system 10 includes a chamber 30 in which the substrate 20—on which the test zone resides—is disposed. A stage 18 is provided so move the substrate 20 as desired, and as described below in more detail. The chamber 30 also preferably includes a heat source 22, such as one of the various heat sources as enumerated above in greater detail.

A controller 16 controls the various elements of the system 10, such as through control lines 32. In the embodiment depicted, the unit 16 that provides the control functions for the system 10 also provides the analyzer and tester functions for the system 10. However, it is appreciated that the present invention is not limited to such a combined unit 16, and the various functions as described herein could be performed by one or more separate units. The system 10 as depicted also includes a chemical source 12 and an exhaust system 14.

The system 10 operates by bringing the substrate 20 into the chamber 30, such as by moving it in on the motorized stage 18. In various embodiments, the chamber 30 is environmentally controlled. Thus, a vacuum could be drawn on the substrate 20, and the heater 22 could heat the substrate 20, such as in a vacuum bake process, all such under the control of the controller 16. The controller 16 further instructs the chemical source 12 to deliver a stabilizing chemical (as describe in greater detail above) to the chamber 30. The stabilizing chemical is dispensed, in the depicted embodiment, through a precision dropper 24, to a location on the substrate 20 that is determined by positioning the substrate 20 with the motorized stage 18. In some embodiments the stabilizing chemical is variously heated prior to delivery to the substrate 20, during the delivery to the substrate 20, and after delivery to the substrate 20.

The controller 16 also controls (in this embodiment) the exhaust system 14, which exhausts contaminants and effluents of the processing, such as through exhaust line 28. After the stabilizing chemical has been dispensed and any desired heating, drying, vacuum, etc. has been performed, the stage 18 moves the chemically-conditioned test zone under the QV implement 26, where a charge is deposited on the surface of the substrate 20 within the test zone, and then a QV based measurement is performed. It is appreciated that this might by performed by several implements 26, and might also be performed at different locations within the chamber 30, rather than with the single implement 26 and position within the chamber 30 as depicted (for simplicity).

When testing is complete, any remaining stabilizing chemicals on the surface of the substrate 20 can be removed, such as by applying heat from the heater 22, using any one or more of the heating methods as described above. The substrate 20 is then removed from the system 10, such as for further processing.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A measurement system for taking a reading in a test zone on a surface of a substrate, the measurement system comprising:
   a chamber for forming an environment,
   a surface treatment station for depositing a stabilizing chemical in the test zone,
   a charge deposition station for depositing a charge in the test zone, and
   a QV measurement station for taking a QV based measurement in the test zone,
   where the surface treatment station, the charge deposition station, and the QV measurement station all interact with the substrate within the chamber, and the stabilizing chemical and the charge are applied from different sources.

2. The measurement system of claim 1, wherein the charge deposition station includes at least one of a corona discharge unit, a plasma generator, and an electron beam generator.

3. The measurement system of claim 1, wherein the environment is at least one of a reduced pressure environment, an atmospheric pressure environment, and an elevated pressure environment filled at least in part with an inert gas.

4. The measurement system of claim 1, wherein the test zone is all of the surface of the substrate.

5. The measurement system of claim 1, further comprising an exhaust system to exhaust contaminants, and effluents of the stabilizing chemicals.

6. The measurement system of claim 1, further comprising a positioning system for moving the substrate within the chamber.

7. The measurement system of claim 1, wherein the surface is formed of at least one of silicon oxide, silicon nitride, silicon oxynitride, silicon carbide, metal oxide, carbon doped oxide, and porous ultra low k materials.

8. The measurement system of claim 1, wherein the stabilizing chemical is in the form of at least one of a liquid, a vapor of the stabilizing chemical, and a mixture of a vapor of the stabilizing chemical and a carrier gas that is substantially inert.

9. The measurement system of claim 1, wherein the stabilizing chemical includes at least one of HMDS, DCDMS, materials with Si—$CH_3$ functional groups, $H_2$, $O_2$, $O_3$, $NH_3$, $HF_x$, and hydrophobic chemical agents.

10. The measurement system of claim 1, wherein the surface treatment station includes a dispenser for dispensing the stabilizing chemical, where the dispenser does not make physical contact with the substrate, the dispenser including at least one of a piezo-actuated liquid injector, a microdropper, a laser injector, a water injector, and a spray nozzle.

11. The measurement system of claim 1, wherein the surface treatment station includes a dispenser for dispensing the stabilizing chemical, with an electrical heater attached to the dispenser.

12. The measurement system of claim 1, further comprising a heater for heating at least one of the substrate and the stabilizing chemical, the heater including at least one of an ion plasma generator, an inductance furnace, a resistance furnace, a heat lamp, a laser, a microwave annealer, and an electron bombarder.

13. A measurement system for taking a reading in a test zone on a surface of a substrate, the measurement system comprising:
   a chamber for forming an environment, wherein the environment is at least one of a reduced pressure environment, an atmospheric pressure environment, and an elevated pressure environment filled at least in part with an inert gas,
   a surface treatment station for depositing a stabilizing chemical in the test zone, wherein the surface treatment station includes a dispenser for dispensing the stabilizing chemical, where the dispenser does not make physical contact with the substrate, the dispenser including at least one of a piezo-actuated liquid injector, a microdropper, a laser injector, a water injector, and a spray nozzle,
   a charge deposition station for depositing a charge in the test zone, wherein the charge deposition station includes at least one of a corona discharge unit, a plasma generator, and an electron beam generator,
   an exhaust system to exhaust contaminants, and effluents of the stabilizing chemicals,
   a positioning system for moving the substrate within the chamber,
   a heater for heating at least one of the substrate and the stabilizing chemical, the heater including at least one of an ion plasma generator, an inductance furnace, a resistance furnace, a heat lamp, a laser, a microwave annealer, and an electron bombarder, and
   a QV measurement station for taking a QV based measurement in the test zone,
   where the surface treatment station, the charge deposition station, and the QV measurement station all interact with the substrate within the chamber.

14. A method for taking a reading in a test zone on a surface of a substrate, the method comprising the sequential steps of:
   forming an environment around the substrate,
   dispensing a stabilizing chemical in the test zone,
   depositing a charge in the test zone, where the charge is applied separately from the stabilizing chemical,
   taking a QV based measurement in the test zone, and
   removing the substrate from the environment.

15. The method of claim 14, further comprising the step of heating the test area for at least one of before, during, and after depositing the stabilizing chemical.

16. The method of claim 14, further comprising the step of heating the stabilizing chemical before dispensing it in the test zone.

17. The method of claim 14, further comprising the step of exhausting from the environment any vapors arising from the stabilizing chemical.

18. The method of claim 14, further comprising the step of removing any substantial residual of the stabilizing chemical from the substrate prior to removing the substrate from the environment.

19. The method of claim 14, wherein the stabilizing chemical includes at least one of HMDS, DCDMS, materials with Si—$CH_3$ functional groups, $H_2$, $O_2$, $O_3$, $NH_3$, $HF_x$, and hydrophobic chemical agents.

20. The method of claim 14, wherein the stabilizing chemical is in the form of at least one of a liquid, a vapor of the stabilizing chemical, and a mixture of a vapor of the stabilizing chemical and a carrier gas that is substantially inert.

* * * * *